(12) United States Patent
Sirringhaus et al.

(10) Patent No.: US 10,476,015 B2
(45) Date of Patent: Nov. 12, 2019

(54) ORGANIC ELECTRONIC/OPTOELECTRONIC DEVICES

(71) Applicants: FLEXENABLE LIMITED, Cambridge (GB); CAMBRIDGE ENTERPRISE LIMITED, Cambridge (GB)

(72) Inventors: Henning Sirringhaus, Cambridge (GB); Mark Nikolka, Cambridge (GB); Iyad Nasrallah, Cambridge (GB); Jan Jongman, Cambridge (GB)

(73) Assignees: FLEXENABLE LIMITED, Cambridge (GB); CAMBRIDGE ENTERPRISE LIMITED, Cambridge (GB)

( * ) Notice: Subject to any disclaimer, the term of this patent is extended or adjusted under 35 U.S.C. 154(b) by 8 days.

(21) Appl. No.: 15/740,611

(22) PCT Filed: Jun. 29, 2016

(86) PCT No.: PCT/EP2016/065137
§ 371 (c)(1),
(2) Date: Dec. 28, 2017

(87) PCT Pub. No.: WO2017/001473
PCT Pub. Date: Jan. 5, 2017

(65) Prior Publication Data
US 2018/0190918 A1 Jul. 5, 2018

(30) Foreign Application Priority Data
Jun. 29, 2015 (GB) .................................. 1511375.6

(51) Int. Cl.
*H01L 51/00* (2006.01)
*H01L 51/05* (2006.01)

(52) U.S. Cl.
CPC ........ *H01L 51/0558* (2013.01); *H01L 51/002* (2013.01); *H01L 51/0003* (2013.01); *H01L 51/0007* (2013.01); *H01L 51/0541* (2013.01)

(58) Field of Classification Search
CPC ............... H01L 51/0558; H01L 51/002; H01L 51/0003; H01L 51/0007; H01L 51/0541
(Continued)

(56) References Cited

U.S. PATENT DOCUMENTS

2009/0066223 A1* 3/2009 Yabe ...................... C09K 11/06
313/504
2014/0014934 A1* 1/2014 Ukeda ................. H01L 51/0545
257/40

FOREIGN PATENT DOCUMENTS

WO 2011087601 A1 7/2011
WO 2012033075 A1 3/2012

OTHER PUBLICATIONS

Lim, E., et al., "Doping effect of solution-processed thin-film transistors based on polyfluorene", Journal of Materials Chemistry, vol. 17, No. 14, 2007, pp. 1416-1420 (5 pages), XP055301980.
(Continued)

*Primary Examiner* — Vu A Vu
(74) *Attorney, Agent, or Firm* — Sughrue Mion, PLLC

(57) ABSTRACT

An electronic or optoelectronic device including a semiconductor layer, wherein the semiconductor layer comprises at least a semiconductive organic material, water species, and at least one additive in an amount of at least 0.1% by weight relative to the semiconductive organic material, which additive at least partly negates a charge carrier trapping effect caused by the water species on the semiconductive organic material.

17 Claims, 17 Drawing Sheets
(15 of 17 Drawing Sheet(s) Filed in Color)

IDTBT devices with various solvents left in the film

(58) Field of Classification Search
USPC .......................................................... 257/40
See application file for complete search history.

(56) References Cited

OTHER PUBLICATIONS

Ma, L., et al., "High performance polythiophene thin-film transistors doped with very small amounts of an electron acceptor", Applied Physics Letters, vol. 92, No. 6, 2008, 3 pages, XP012108241.
International Search Report dated Sep. 27, 2016 from the International Bureau in counterpart International application No. PCT/EP2016/065137.
Yamagishi, Y., et al., "Organic field-effect transistors with molecularly doped polymer gate buffer layer" Synthetic Metals, vol. 162, No. 21-22, 2012, pp. 1887-1893 (7 pages), XP055301998.
Levermore, P., et al., "Organic Light-Emitting Diodes Based on Poly(9,9-dioctylfluorene-co-bithiophene) (F8T2)," Advanced Functional Materials, vol. 19, No. 6, 2009, pp. 950-957 (8 pages), XP001521179.
Lüssem, B., et al., "Organic Junction Field-Effect Transistor", Advanced Functional Materials, vol. 24, No. 7, 2014, pp. 1011-1016 (6 pages) XP001588675.

\* cited by examiner

Pure IDTBT

IDTBT with 2% dopant F4TCNQ

IDTBT with 2% additive TCNQ

UPS spectra of F4TCNQ (left) und TCNQ (right) doped (IDTBT)

IDTBT devices with various solvents left in the film

IDTBT constant current stress on annealed vs unannealed films

Poly(9,9-dioctylfluorene-*alt*-benzothiadiazole) (F8BT) OFET with (green) and without (black) solvent in the film Poly-diketopyrrolopyrrole-co-dithienothiophene (DPP-DTT) OFET with (green) and without (black) solvent in the film DPP-DTT constant current stress on annealed vs unannealed films

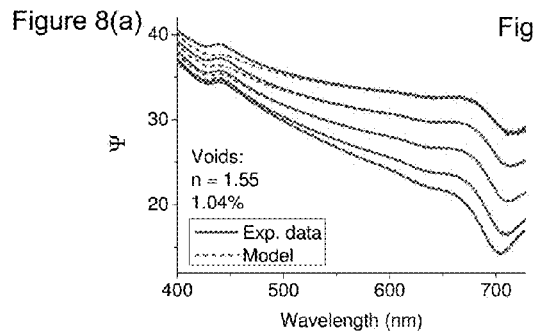
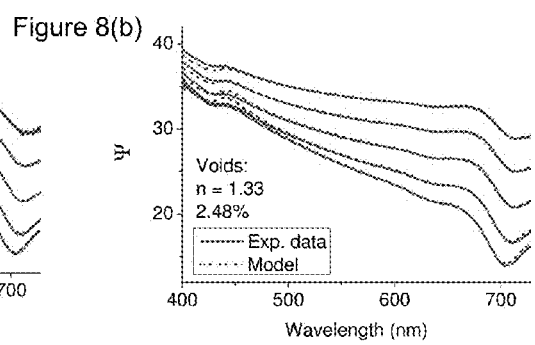
Ellipsometry measurements on unannealed (a) and annealed (b) IDTBT films
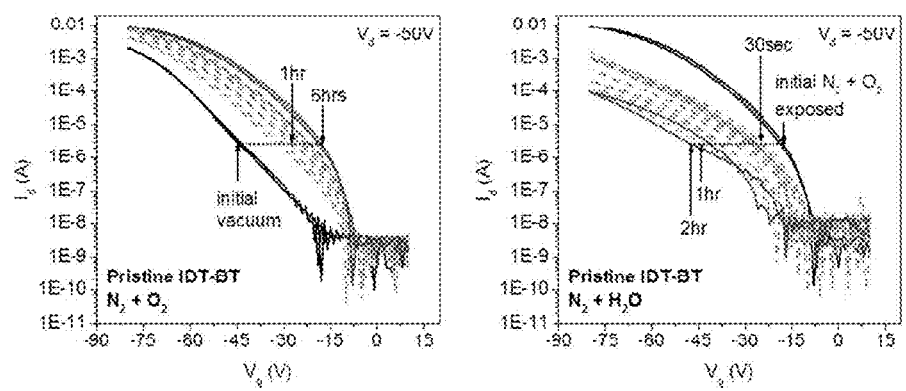
IDTBT constant current stress on annealed vs unannealed films
Figure 9(a)

Water removal by Cobalt(II) Chloride (left) Improvement in transfer characteristics and (right) Improvement in constant current stress stability

ORGANIC ELECTRONIC/OPTOELECTRONIC DEVICES

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable

CROSS REFERENCE TO RELATED APPLICATIONS

This application is a National Stage of International Application No. PCT/EP2016/065137 filed Jun. 29, 2016, claiming priority based on United Kingdom Patent Application No. 1511375.6 filed Jun. 29, 2015, the contents of all of which are incorporated herein by reference in their entirety.

BACKGROUND OF THE INVENTION

Field of the Invention

Electronic/optoelectronic devices based on organic semiconductors (hereafter referred to as "organic devices") are increasingly attracting interest for more and more applications because of the high on-currents and good on-off ratios increasingly achievable in organic semiconductor films deposited from solution at low temperatures and the inherently flexible, mechanical properties of organic semiconductors which enable electronics in flexible form factors.

However, in addition to high on-current and high on-off ratio, another increasingly important requirement for electronic/optoelectronic devices is good performance stability over time, when devices are exposed to various atmospheres and operated for extended periods of time.

The inventors for the present application have found that the performance stability (i.e. stress and environmental stability) of organic devices can be relatively poor, and an aim of the present invention is to provide a technique by which the performance stability of an organic device can be improved.

DESCRIPTION OF RELATED ART INCLUDING INFORMATION DISCLOSED UNDER 37 CFR 1.97 AND 1.98

Not applicable

BRIEF SUMMARY OF THE INVENTION

There is hereby provided an electronic or optoelectronic device including a semiconductor layer, wherein the semiconductor layer comprises at least a semiconductive organic material, water species, and at least one additive in an amount of at least 0.1% by weight relative to the semiconductive organic material, which additive at least partly negates a charge carrier trapping effect caused by the water species on the semiconductive organic material.

There is also hereby provided an electronic or optoelectronic device including a semiconductor layer, wherein the semiconductor layer comprises at least a semiconductive organic material, and at least one additive in an amount of at least 0.1% by weight relative to the semiconductive organic material, which additive occupies at least some voids within the semiconductive organic material occupiable by water molecules, and has a smaller charge carrier trapping effect on the semiconductive organic material than water.

There is also hereby provided a method comprising operating the above-described devices with said additive included in said semiconductor layer in said amount, wherein operating the device comprises electrically varying the conductivity of a portion of the semiconductor layer.

There is also hereby provided a method of producing an electronic or optoelectronic device comprising forming a stack of layers including a semiconductor layer comprising a semiconductive organic material, wherein forming said stack of layers comprises depositing at least one molecular additive material that at least partly negates a charge carrier trapping effect caused by water molecules on the semiconductive organic material; and retaining the additive in said stack to an extent that the molecular additive exists in the semiconductor layer in an amount of at least 0.1% by weight relative to the semiconductive organic material.

There is also hereby provided a method of producing an electronic or optoelectronic device comprising forming a stack of layers including a semiconductor layer comprising a semiconductive organic material, wherein forming said stack of layers comprises depositing at least one molecular additive material that occupies at least some voids within the semiconductive organic material occupiable by water molecules, and has a smaller charge carrier trapping effect on the semiconductive organic material than water; and retaining the additive in said stack to an extent that the molecular additive exists in the semiconductor layer in an amount of at least 0.1% by weight relative to the semiconductive organic material.

According to one embodiment, said device is an electronic switching device.

According to one embodiment, the at least one additive reduces the threshold voltage change of the electron switching device to less than 1V (preferably less than 0.7V) in a stress test involving operating the electronic switching device in a saturation regime at a drain current of about 2.5 μA for a period of 25 hours.

According to one embodiment, the additive comprises molecules having a size less than 5 nm, more preferably less than 2 nm, and further more preferably less than 1 nm.

According to one embodiment, the electronic switching device is a p-type semiconductor device, and the additive comprises a material having an electron affinity less than the ionization potential of the semiconductive organic material by at least 0.1 eV, more preferably by at least 0.3 eV, and more preferably by at least 0.5 eV.

According to one embodiment, the additive shifts the threshold voltage by no more than 2 V, more preferably by no more than 1V and most preferably by no more than 0.3V.

According to one embodiment, the additive reduces the organic semi-conductor mobility by no more than 20%, preferably by no more than 5%, and most preferably by no more than 2%.

According to one embodiment, the additive increases the transistor off current by no more than 10×, preferably by no more than 5×, and most preferably by no more than than 1.2×.

According to one embodiment, the electronic switching device is a p-type semiconductor device, and the additive comprises a material having an ionization potential greater than the ionization potential of the semiconductive organic material by more than at least 0.3 eV, more preferably by more than at least 0.5 eV, and further more preferably by more than at least 1 eV.

According to one embodiment, the additive comprises a molecular material having a molecular weight of less than 5% of the number average molecular weight of the semiconductive organic material, preferably less than 3% and most preferably less than 1%.

According to one embodiment, the additive has a higher solubility at room temperature in the organic semiconductive material than water has in the organic semiconductive material.

According to one embodiment, the additive has a solubility of at least 0.1% in water.

According to one embodiment, the semiconductor layer comprises residual water molecules in an amount of at least 0.1% by weight.

According to one embodiment, the semiconductor layer is encapsulated together with one or more other layers of the device against the ingress of oxygen.

According to one embodiment, said molecular additive is liquid at room temperature and is a solvent for the semiconductive organic material, wherein the solubility of the semiconductive organic material in the liquid molecular additive is at least 0.1% by weight.

According to one embodiment, the boiling point of said additive is higher than 150° C., preferably higher than 180° C. and most preferably higher than 200° C.

According to one embodiment, said molecular additive is solid at room temperature and has a solid solubility higher than 1% by weight in the semiconductive organic material.

According to one embodiment, the incorporation of the molecular additive reduces the threshold voltage shift of the electronic switching device in a stress test by 50% compared to that of a reference device, in which no molecular additive is incorporated in said semiconductive organic material, wherein said stress test involves operating the device in the saturation regime at a drain current of about (0.25 μA×W/L) for a period of 25 hours, where W and L are the channel width and channel length of the electronic switching device.

According to one embodiment, the incorporation of said additive in said semiconductive organic material does not significantly increase the OFF-current of the electronic switching device.

According to one embodiment, the amount of said additive is at least 1% by weight relative to the semiconductive organic material.

According to one embodiment, said semiconductive organic material comprises a polymer.

According to one embodiment, said additive is a solvent used to deposit the semiconductive organic material.

According to one embodiment, the method comprises depositing said additive as part of a mixture for a layer of said stack other than the semiconductor layer.

According to one embodiment, the method comprises retaining the additive in said stack to an extent that the additive exists in the semiconductor layer in an amount of at least 1% by weight relative to the semiconductive organic material.

Embodiments of the present invention are described hereunder in detail, by way of example only, with reference to the accompanying drawings.

The patent or application file contains at least one drawing executed in color. Copies of this patent or patent application publication with color drawing(s) will be provided by the Office upon request and payment of the necessary fee.

BRIEF DESCRIPTION OF THE SEVERAL VIEWS OF THE DRAWINGS

FIG. 8 a) and b) show ellipsometry measurements on unannealed and annealed IDTBT films indicating the amount of liquid additive (solvent) present in the polymer film.

DETAILED DESCRIPTION OF THE INVENTION

The following detailed description relates to the example of top-gate organic transistors, but the same technique is equally applicable to other types of transistors such as bottom-gate transistors or dual gate transistors and other types of electronic/optoelectronic devices.

Figure 1:
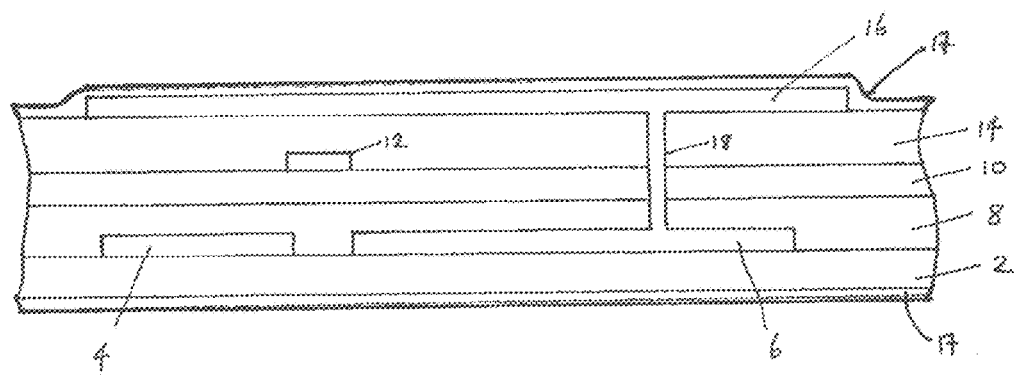
FIG. 1 is a schematic drawing of one example of an organic transistor.

With reference to FIG. 1, a non-limiting, example of a top-gate organic transistor is defined by a stack of layers supported on a rigid or flexible support substrate 2. The stack of layers includes a conductor layer defining source and drain electrodes 4, 6; a semiconductor layer 8 defining a semiconductor channel between the source and drain electrodes; a further conductor layer defining a gate electrode 12 capacitively coupled to the semiconductor channel via a gate dielectric layer 10; an electrically-insulating passivation layer 14 formed over the gate electrode; and yet a further conductor layer defining a pixel electrode 16 connected to the drain electrode through a via-hole 18 formed in the stack. The stack may be encapsulated against the ingress of oxygen by encapsulating films 17. Each layer may comprise a respective stack of sub-layers. For example, the conductor layer defining the source and drain electrodes 4, 6 may comprise a lower sub-layer of a material exhibiting good adhesion to the surface of the underlying support substrate, and an upper sub-layer of a material exhibiting a better electrical conductivity than the material of the lower sub-layer. The organic transistor may also comprise additional elements; for example, the organic transistor may include a self-assembled monolayer of organic material on the upper surface of the source and drain electrodes 4. 6 to better facilitate the transfer of charge carriers between the source/drain electrodes 4, 6 and the semiconductor 8.

FIG. 1 only shows one transistor but a typical transistor device comprises an array of transistors in which: (a) the lower conductor layer defines an array of source conductors each providing the source electrodes for a respective line of transistors and connected to a respective terminal of a source driver chip, and an array of drain conductors each providing the drain electrode for a respective transistor; (b) the second conductor layer defines an array of gate lines each providing the gate electrodes for a respective column of transistors and each connected to a respective terminal of a gate driver chip; and (c) the third conductor layer defines an array of pixel electrodes each connected to a drain conductor of a respective transistor. The electric potential at each pixel electrode can be controlled independently because each transistor is associated with a unique combination of source conductor and gate line.

One example of an application for an organic transistor is in the production of active matrix organic light-emitting display devices (AMOLEDs), in which the optical output of pixels of an organic light-emitting material are controlled by respective transistors (or respective sets of transistors).

In the finished device, the semiconductor layer (along with other elements of the device such as oxygen-sensitive elements comprising reactive metals) may be encapsulated against the ingress of oxygen; which encapsulation is shown schematically in FIG. 1.

Figure 2:
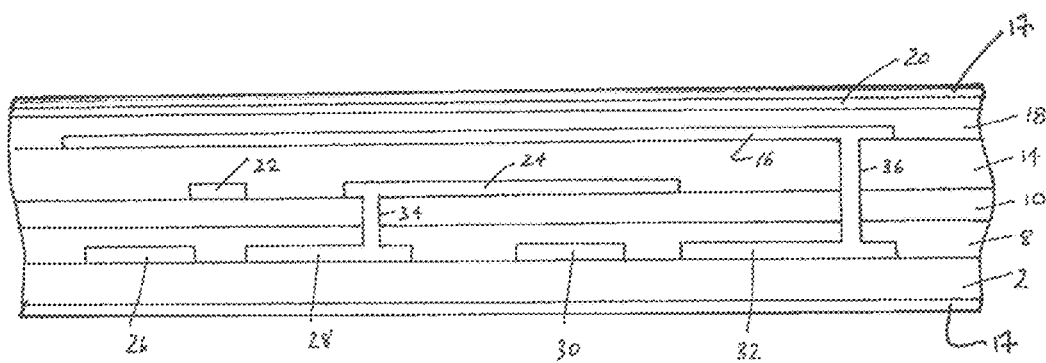
FIG. 2 is a schematic drawing of another example of an organic transistor integrated together with an organic light-emitting device whose output is controlled by the organic transistor.
Figure 3A:
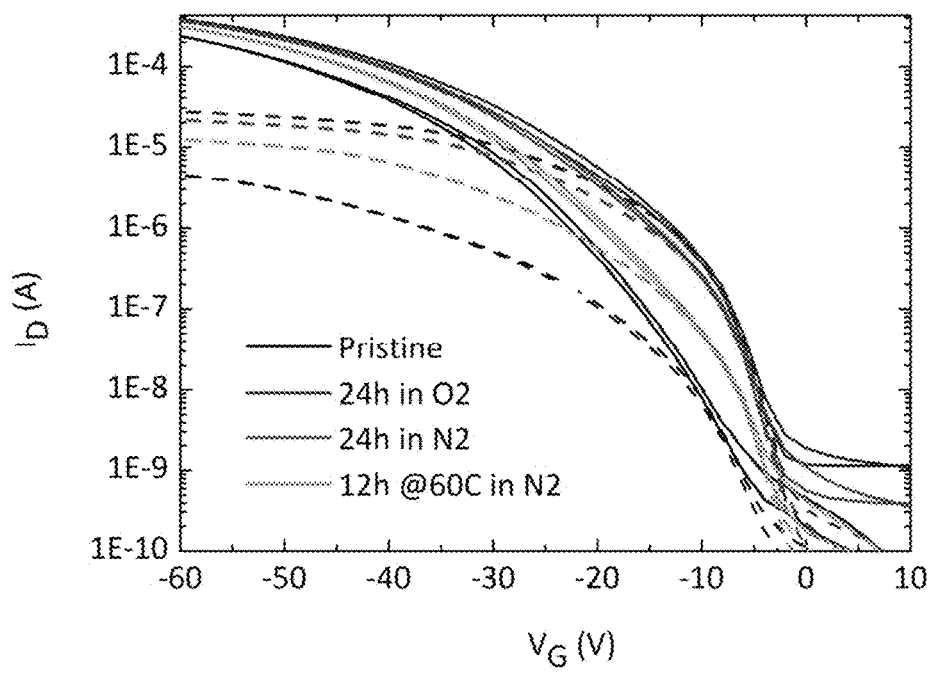
FIGS. 3(a) to 3(e) show experimental results indicating the improved environmental stability and device uniformity upon incorporation of various additives into the semiconducting film of a p-channel organic transistor.
Figure 3B:
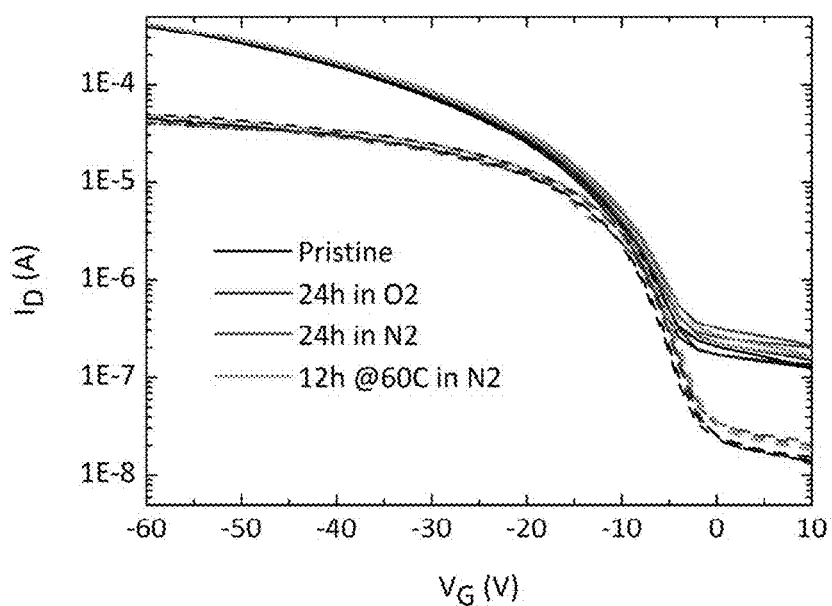
Figure 3C:
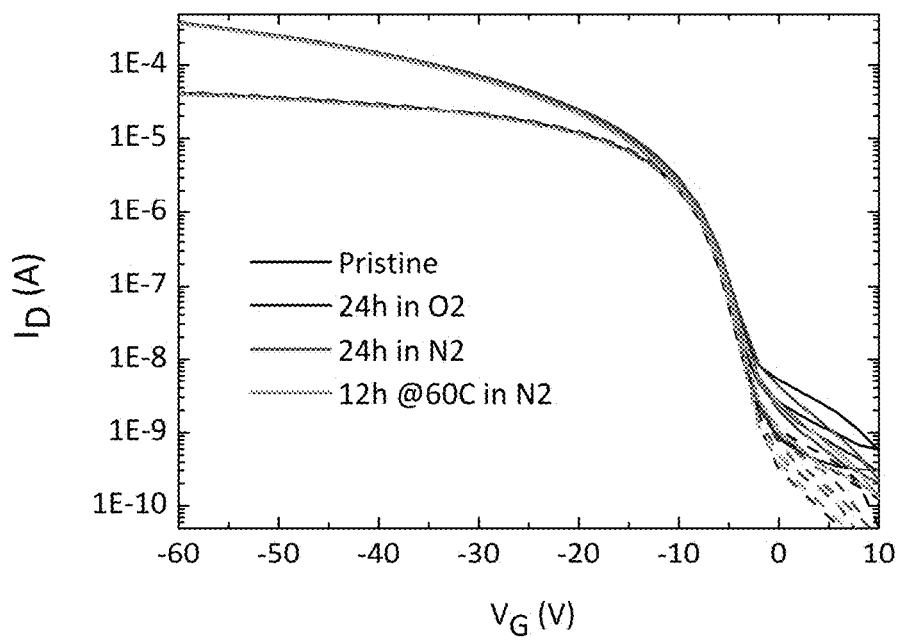
Figure 3D:
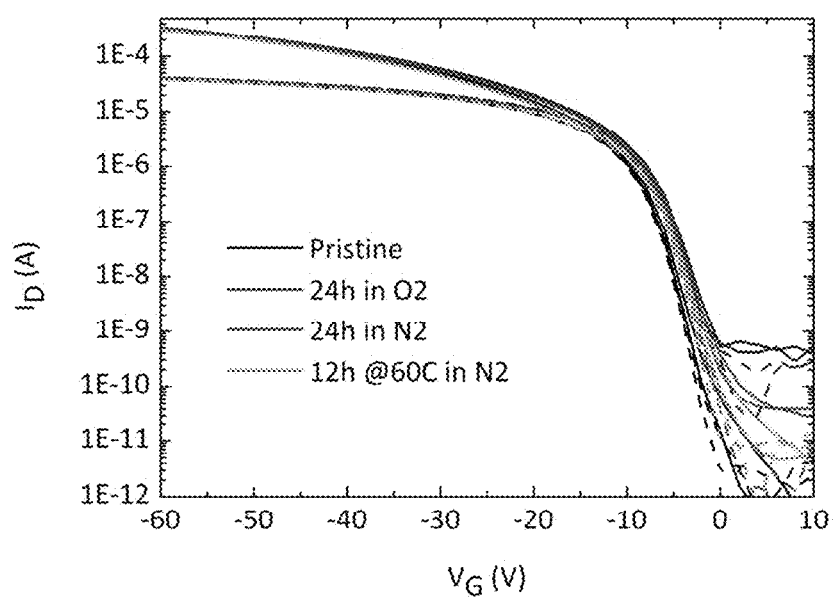
Figure 3E:
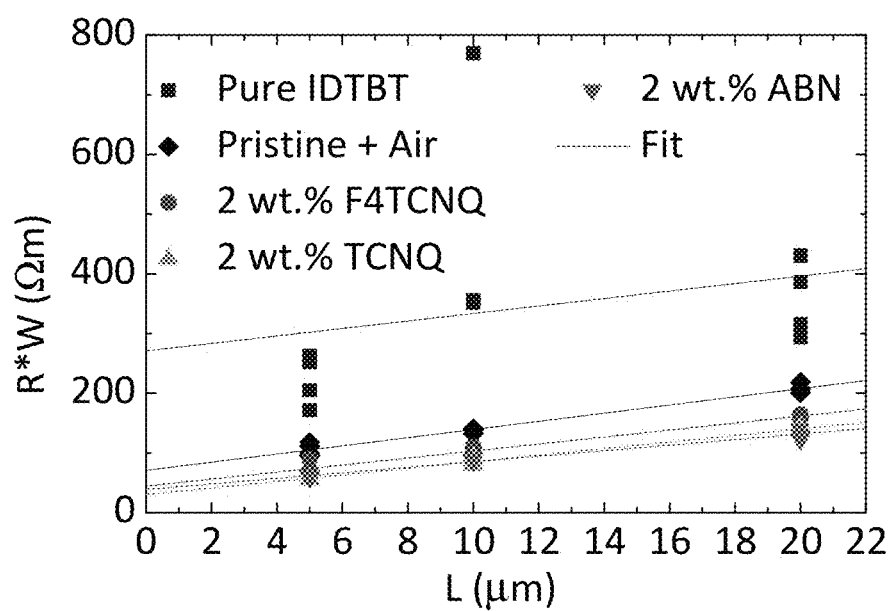

With reference to FIG. 2, one non-limiting example of an architecture for an AMOLED is one in which each pixel is associated with at least 2 respective transistors and a respective memory element in the form of a capacitor (referred to as 2T1C). In this example of a more complex architecture, the source driver chip is connected to the source conductor 26 of the switch transistor (secondary TFT); and the gate driver chip is connected to the gate conductor 22 of the switch transistor (secondary TFT). The drain conductor 28 of the switch TFT (secondary TFT) is connected to the gate conductor 24 of the drive TFT (primary TFT); the source conductor 30 of the drive TFT (primary TFT) is connected to a power supply Vdd; and the drain conductor 32 of the drive TFT (primary TFT) is connected to the respective pixel electrode 16. The capacitor mentioned above is formed between the gate conductor 24 of the drive TFT and the source conductor 30 of the drive TFT (primary TFT). The circuitry for each pixel can also contain compensation circuits. A large variety of compensation circuits exist having four to seven TFTs and one or more capacitors. These compensation circuits can compensate for a shift in the threshold voltage of the light-emitting device (e.g. organic light emitting device (OLED)) of the respective pixel and/or a shift in the voltage threshold or drop in mobility of the drive TFT for the respective pixel. FIG. 2 additionally shows the integration of an organic light-emitting device including a layer of light-emissive material 18, and a common electrode 20 formed over the layer of light-emissive material serving as the counter electrode to the pixel electrode 16. For example, the pixel electrode may form the cathode of the light-emitting device and the common electrode 20 may form the anode of the light-emitting device. Again, encapsulating films 17 may be provided if other layers of the stack do not already encapsulate the semiconductor and any other oxygen-sensitive elements against the ingress of molecular oxygen. Again, the organic transistor may also comprise additional elements, and one or more layers may comprise a stack of sub-layers.

FIG. 2 only shows one pixel but an AMOLED typically comprises an array of thousands or millions of pixels in which (for the specific example of top-gate transistors shown in FIG. 2): (a) the lower conductor layer defines an array of source conductors each providing the source electrodes of the switch TFTs for a respective line of pixels and each connected to a respective terminal of a source driver chip, an array of drain conductors each providing the drain electrode for a respective pixel, and one or more conductors providing the source electrodes for the drive TFTs; (b) the second conductor layer defines an array of gate lines each providing the gate electrodes of the switch TFTs for a respective column of pixels and each connected to a respective terminal of a gate driver chip, and an array of gate conductors each providing the gate electrode of the drive TFT of a respective pixel; and (c) the third conductor layer defines an array of pixel electrodes each connected to a drain conductor of the drive TFT of a respective pixel. Again, the current through the light-emissive material at each pixel can be controlled independently because each switch TFT is associated with a unique combination of source conductor and gate line.

The inventors for the present application have observed a high variation in device performance depending on the environment the devices are stored and measured in. A first experiment involved measuring the transistor characteristic of a transistor after storage in different environments. Four different top-gate organic transistors were the subject of the experiment. The first was a bottom-contact, top-gate transistor comprising a glass support substrate, source/drain electrodes photolithographically patterned from a conductor layer stack comprising a lower layer of titanium and an upper layer of gold; the poly-indaceno-dithiophene-co-benzothiadiazole (IDTBT) conjugated co-polymer as the organic semiconductor; a CYTOP® fluoropolymer for the gate dielectric; and gold for the gate electrode. The IDTBT conjugated polymer semiconductor was deposited from solution. The other transistors were identical in architecture with the exception that 2 wt. % (relative to the polymer) of a small organic molecule was incorporated in solution as an additive. This additive will be referred to as a molecular additive in the following. The molecular additives are F4-TCNQ (2,3,5,6-tetrafluoro-7,7,8,8-tetracyanoquinodimethane), TCNQ (7,7,8,8-tetracyanoquinodimethane), and ABN (4-Aminobenzonitrile).

FIG. 3 shows the measured transistor characteristic immediately after manufacture in a nitrogen environment (black line—bottom of set of 4 lines), after 24 hours exposure to air (blue line—top of set of 4 lines), again after a further 24 hours storage in a nitrogen gas environment (red line—$2^{nd}$ top of set of 4 lines), and finally after annealing overnight in a nitrogen glovebox (green line—$2^{nd}$ bottom of set of 4 lines), consecutively. FIG. 3 a) shows these for a pure transistor with no additives. The device characteristics depend strongly on the atmosphere in which the device is stored and measured, in particular under condition where no or little oxygen is present, the device characteristics are degraded as evidenced by a sluggish turn-on characteristics. FIG. 3 b) shows these for a transistor with F4-TCNQ as an additive, FIG. 3 c) shows these for a transistor with TCNQ as an additive, and FIG. 3 d) shows these for a transistor with ABN as an additive. In the films comprising a molecular additive the characteristics are good and independent of the atmosphere in which the devices are stored/measured. The results of these experiments indicate that a desirable improvement in performance and environmental stability can be achieved just by incorporating small molecule additives into the organic semiconductor thin film. The dashed lines in FIGS. 3 (a) to 3(d) show the linear regime transfer characteristics at Vds=−5V; and the continuous lines show the saturation regime transfer characteristics at Vds=−50V; FIG. 3 e) additionally shows an experiment involving the measurement of 12 devices with differing channel length (4×20 um, 4×10 um and 4×5 um). This experiment commonly referred to as transfer length measurement (TLM) allows for the extraction of contact resistance from the y-axis intercept as well as assessing device uniformity. The experiment unambiguously shows that incorporation of additives into the host organic semiconductor leads to a significantly increased device uniformity as well as a reduction of contact resistance.

Among the molecular additives used F4-TCNQ is a charge transfer dopant for the organic semiconductor IDTBT, because the electron affinity of F4-TCNQ is close to and possibly even larger than the ionization potential of IDTBT. This should lead to an electron charge transfer from an occupied molecular orbital of the organic semiconductor to an empty molecular orbit of the dopant F4-TCNQ and lead to an undesirable increase in the OFF current of the transistor. This is indeed observable in FIG. 3(b) where the OFF current of the F4-TCNQ device is on the order of $10^{-7}$ A, i.e. 1-2 orders of magnitude higher than that of the pristine IDTBT film (FIG. 3(a)). This is as expected; the use of small molecule dopants with high electron affinity so they can act as p-type dopants for organic semiconductor films (or with low ionization potential to act as n-type dopants) has in fact been widely studied in order to reduce contact resistance effects in organic transistors (see for example, Cho et al., APL 92 063310 2008).

The surprising discovery that the inventors of the present invention have made is that the other molecular additives that have electron affinities significantly above that of the ionization potential of IDTBT and cannot act as dopants, as evidenced by the absence of an increased OFF current and further demonstrated by the photoemission results of FIG. 6 discussed below, have a similar beneficial effect as the dopant additive, F4-TCNQ, on the contact resistance as well as on the environmental stability. This suggests that it is possible to use molecular additives that do not act as dopants to a beneficial effect without the disadvantage of an increased OFF current.

Exposure to oxygen has a similar beneficial effect on the performance and stability of pure IDTBT transistors (without molecular additive, see FIG. 3a), but this effect is not permanent and the device degrades again in an oxygen deficient atmosphere. Furthermore, the inclusion of molecular oxygen in the host semiconductor is not compatible with the use of the organic transistor in integrated devices including oxygen-sensitive elements, such as the reactive metal cathodes of state-of-the-art electronic light-emitting devices, because the molecular oxygen can migrate from the transistor semiconductor to the oxygen-sensitive elements and degrade their performance. The use of additives can achieve the above-described improvement in transistor performance stability without the same risk of degradation to any oxygen-sensitive elements integrated together with the organic transistor.

Figure 4A:
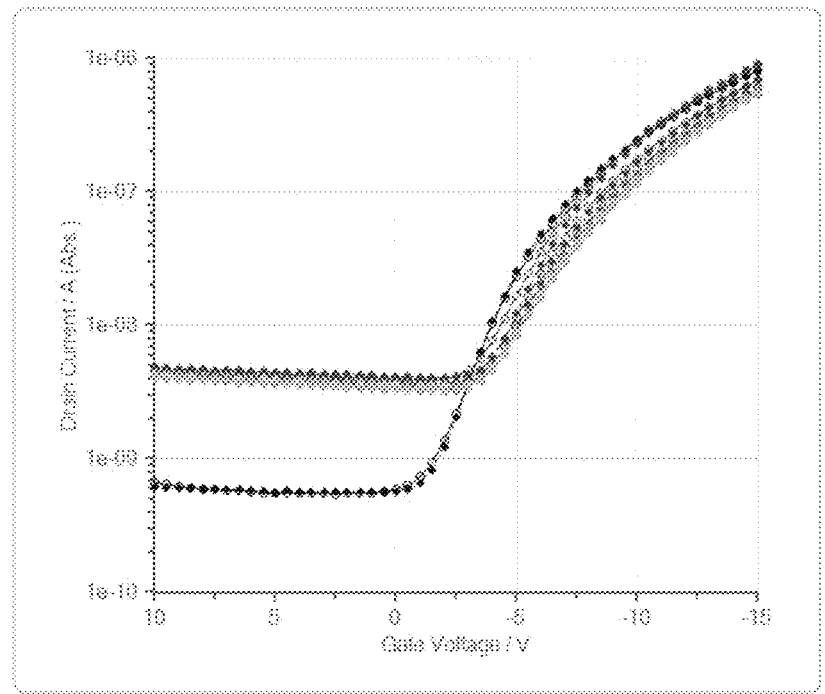
FIGS. 4(a) and 4(b) show the results of an experiment involving measuring the transistor characteristics at different times during a high temperature storage (HTS) test of another example transistor according to an embodiment of the present invention, and a reference transistor.
Figure 4B:
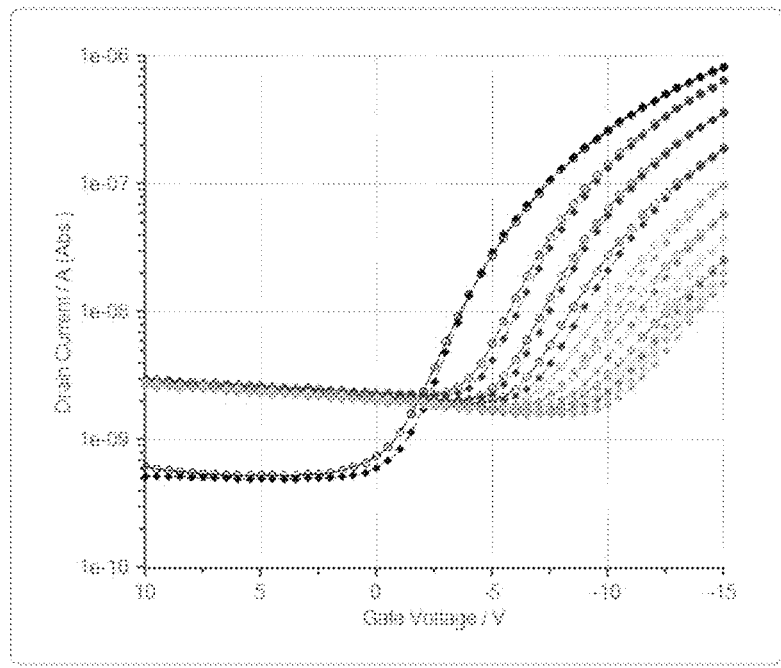

A further experiment involved subjecting organic transistors to a heat storage test in a vacuum environment and measuring the transistor characteristic at different times during the heat storage test. The heat storage test involved storing the transistor in a vacuum environment ($1.7\times10^{-2}$ mbar) at a temperature of 70° C. Again, two types of top-gate organic transistors were the subject of the experiment. The first was a transistor comprising an conjugated semiconductor polymer (without any additives) having an ionization potential of 5.3 eV deposited from solution and a SU-8 epoxy-based polymer layer with 7% by weight of a molecular additive 2,5-dichloro-1,4-benzoquinone as additive over the gate electrode and the gate dielectric. The second transistor was exactly the same as the first transistor except that the passivation layer over the gate electrode and gate dielectric was did not comprise an additive in the SU-8 epoxy-based polymer layer. As shown in FIG. 4, the first transistor (SU-8 with 2,5-dichloro-1,4-benzoquinone) shows a remarkably small variation in transistor characteristic over the 45 hour duration of the heat storage test, compared to the second transistor (SU-8 passivation layer without additive). In FIGS. 4(a) and 4(b), each line shows the transistor characteristic at a respective time during the heat storage test ranging from T=0 hours (blue line) to T=45 hours (light brown line). This shows that the molecular additive may not need to be present in the organic semiconductor layer during deposition, but can be introduced into another organic layer in the device stack in close proximity to the organic semiconductor layer, from which it may then diffuse into the organic semiconductor layer. Other examples of device elements from which to introduce the molecular additive into the semiconductor are (i) an organic gate dielectric layer and/or (ii) an organic planarisation layer on which the source/drain conductors are formed, in addition to or as an alternative to introducing the additive into the semiconductor from an organic passivation layer deposited over the gate dielectric and gate electrode.

One or more barrier layers may be provided within the stack of layers that defines the transistors to reduce the diffusion of the additive out from the organic semiconductor layer into one or more other parts of the device. For the example of an OLED device, these one or more barrier layers may be in addition to one or more barrier layers that protect oxygen-sensitive elements, such as the reactive metal cathodes, against degradation by atmospheric oxygen.

The inventors for the present application have observed a high variation in the threshold voltage in p-channel organic transistors before and after stress/storage testing of the transistors, particularly in an inert environment, and it has been found by experiment that the threshold voltage stability can be improved by introducing a solid, liquid or gaseous molecular additive into the host organic semiconductor. A high threshold voltage stability can be an important requirement for display applications of organic transistors, in particular for applications in OLED displays, in which high threshold voltage stability for the pixel drive transistor is key to maintaining a constant drive current (and thereby constant OLED luminance) for a given electrical input. Reference is made to H. Sirringhaus, Advanced Materials, DOI: 10.1002/adma.201304346, the entire content of which is included herein by reference.

An experiment involved subjecting organic transistors to a stress test in an inert, nitrogen gas environment as well as in ambient air and extracting the threshold voltage at different times during the stress test and also during a subsequent period of recovery in the respective environment. The stressing involved shorting the drain and gate electrodes in order to operate the transistor in the saturation regime. A drain current of $-2.5$ μA was applied (as per the testing regime presented in H. Sirringhaus, Advanced Materials, DOI: 10.1002/adma.201304346) for the 25 hour duration of the stress experiment. The ratio of the channel width W to the channel length L of this device was 10. If a different W/L ratio is used the stress current I should be adjusted according to I=0.25 μA×W/L. A transfer characteristic was obtained in 5 hour intervals during the stress. After the 25 hour stressing period, the shorting between the drain and gate was removed, as well as the current, and the transfer characteristic was monitored over 21 hours, initially in 5 minute intervals and then in 5 hour intervals, monitoring the transistor's recovery.

Figure 5:
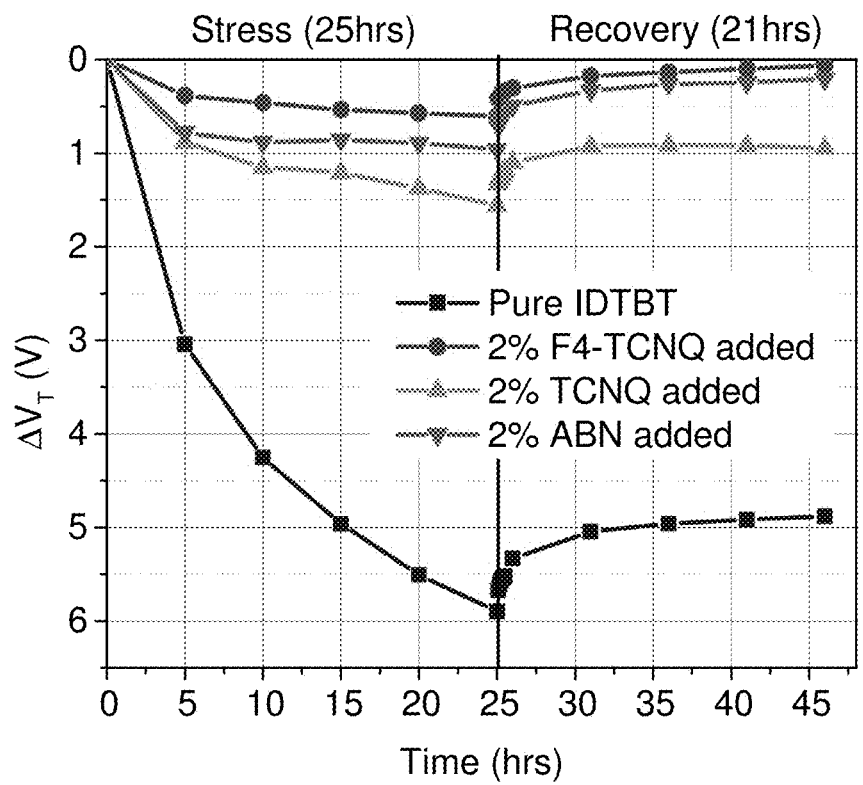
FIG. 5 shows the results of an experiment involving the extraction of the threshold voltage at different times both during a stress test and during a subsequent recovery period of transistors according to one embodiment of the present invention and a reference transistor. The stresses are performed in a nitrogen environment on transistors with various additives incorporated in the semiconductor.

FIG. 5 shows a summary of the change in threshold voltage of IDTBT-based p-channel transistors during a constant-current stress experiment at 2.5 uA between the source and drain electrodes for 25 hours. It also shows the subsequent recovery of the threshold voltage over a 21 hour period with all electrodes grounded. The threshold voltage was determined by taking the square root of the saturation transfer curve, and taking a linear fit (and extrapolating) of the graph over a 10V range at sufficiently high voltages. Alternative techniques for determining the threshold voltage may also be used (as discussed in H. Sirringhaus, Advanced Materials, DOI: 10.1002/adma.201304346). The transistors shown have various additives, and are compared to a transistor with no additive incorporated. The stresses and recovery were carried out in a nitrogen environment. The IDTBT transistors with 2% of molecular additives added show a remarkably small variation in threshold voltage (ΔVt 0.6-1.5V) over the 25 hour duration of the stress test, compared to the transistor not comprising any additive (pure IDTBT). This is observed not only for F4-TCNQ, but also the additives that cannot act as charge transfer dopants for the organic semiconductor. This shows clearly that the incorporation of a molecular additive that does not act as a charge transfer dopant to the organic semiconductor film can improve not only the environmental stability and contact resistance behaviour, but also the operational stress stability.

Figure 6:
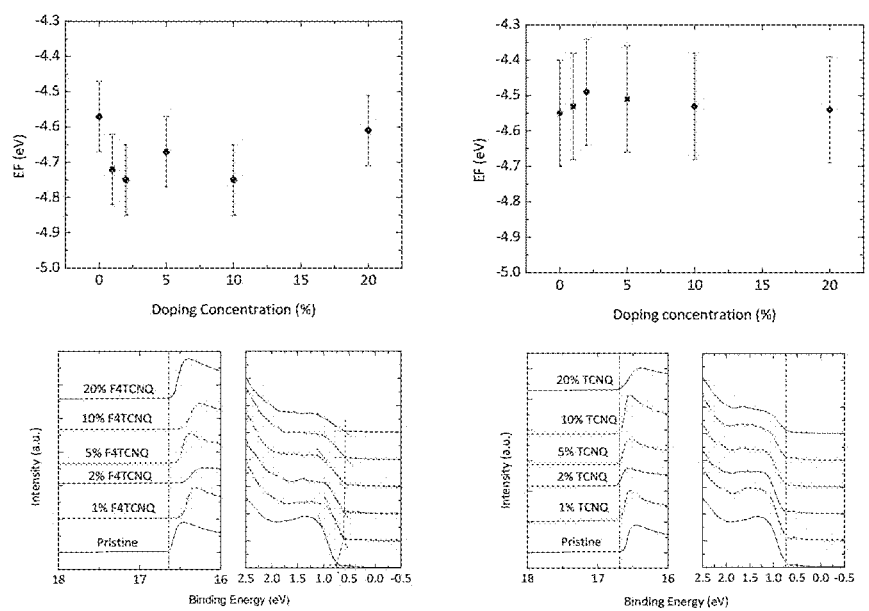
FIG. 6 compares Ultraviolet Photoelectron Spectroscopy (UPS) data of IDTBT films with F4TCNQ (left) and TCNQ (right) added at levels of 0, 1, 2, 5, 10 and 20%. The extracted shift in Fermi level is shown in the top panels whereas the experimental UPS spectra for all films are shown in the bottom panel respectively.

FIG. 6 shows Ultraviolet Photoelectron Spectroscopy (UPS) data of IDTBT films with F4TCNQ (left) and TCNQ (right) added at levels of 0, 1, 2, 5, 10 and 20%. The films' Fermi level (i.e. the energetic level of charge transport) was extracted from the experimental UPS spectra and is shown in the top panel of FIG. 6. The data reveals a noticeable shift in Fermi level when adding F4TCNQ to IDTBT films. There is hence, a clear doping effect observed in such films as explained above on the basis of the molecular energy diagram for F4-TCNQ and IDTBT. However, importantly, when adding the TCNQ to IDTBT films on the other hand, no shift in Fermi level can be observed. This indicates that TCNQ is not doping IDTBT and hence, there is no active charge transfer from the polymer to the dopant. This finding can be explained by the difference in electron affinity of the dopants F4TCNQ (Ef=−5.3 eV) and TCNQ (Ef=−4.8 eV) as compared to the peak ionization potential for IDTBT which is about 5.3 eV. However, since both additives lead to a comparable improvement in device stability and performance, doping can in fact be excluded as the origin of the improved OFET performance and stability.

The inventors of the present invention have further explored the use of other molecular additives. A simple way to introduce molecular additives into organic semiconductor films is to leave residual solvent in the film after solution deposition of the organic semiconductor film. In contrast to the findings described above, it has been commonly believed in both the academic and industrial organic electronics community that residual solvent is detrimental to the performance, lifetime and stability of organic semiconductor devices, such as light-emitting diodes or transistors (Chemical impurity effects on transport in polymer transistors R. A. Street, et al. Phys Rev B76, 045208).

In the case of transistors, this belief stems from earlier work on highly crystalline semiconductors (such as PBTTT) or small molecules (such as tips-Pentacene) where residual solvent can impact the ability of the organic semiconductor to form highly ordered and densely packed crystalline domains. As a result commonly processing conditions are used that remove residual solvents from the films by a low-temperature annealing step of sufficient duration to remove the solvent from the film. The inventors of the present invention have made the surprising discovery that solvents left in the films after film deposition can act in a similar way as the molecular additives discussed above and significantly improve the performance and environmental and operational stability of the transistors.

Figure 7A:
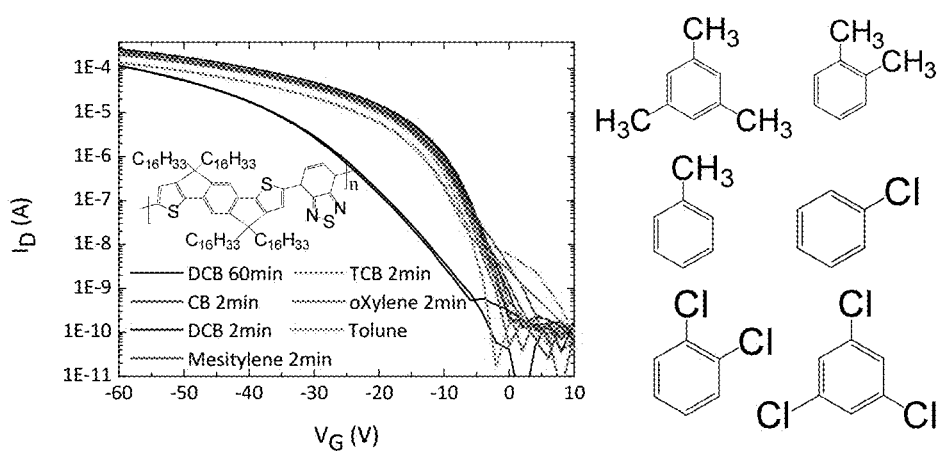
FIGS. 7 a) to e) show experimental results indicating improved performance and stability for as-cast devices as compared to annealed devices. The performance enhancement is observed throughout a wide class of polymers. 7(a) and (b) show this for IDTBT, (c) shows this for F8BT, and (d) and (e) show this for DPP-DTT.
Figure 7B:
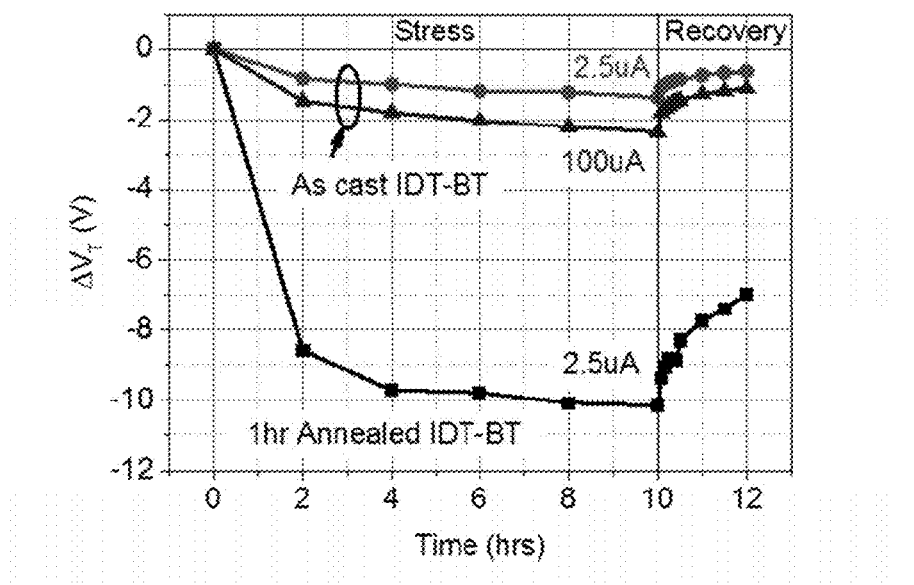
Figure 7C:
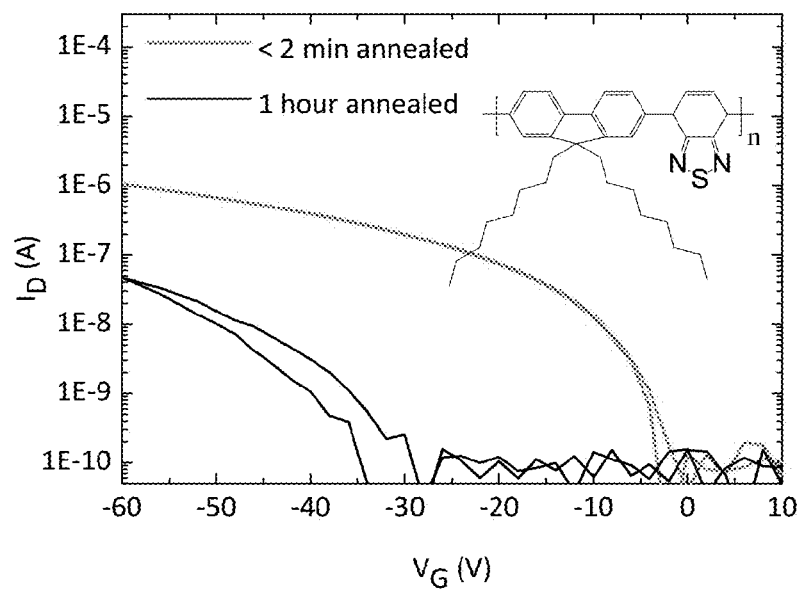
Figure 7D:
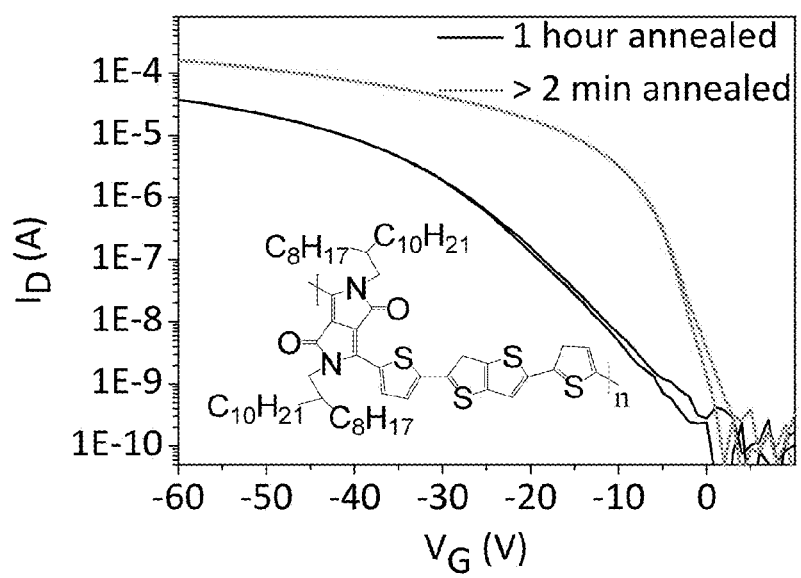
Figure 7:
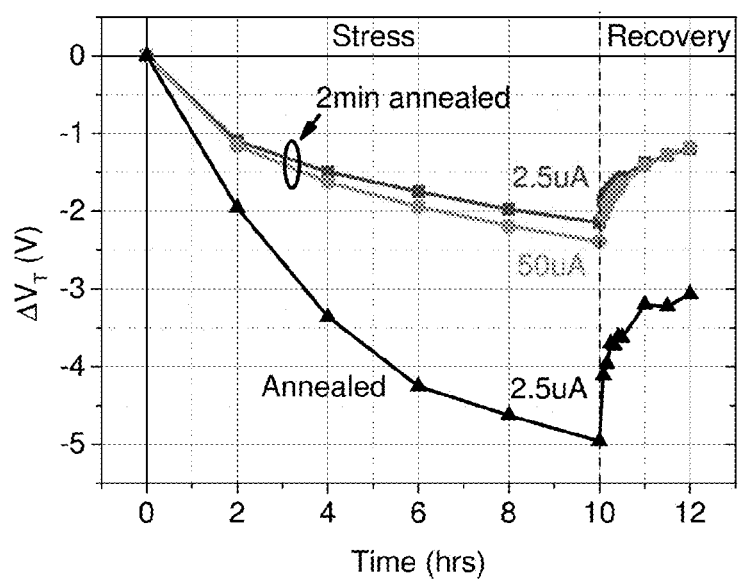

FIG. 7 shows experiments on improving device performance and stability by deliberately leaving solvents in the polymer films. FIG. 7 (a) benchmarks the performance of IDTBT transistors that are annealed for 2 minutes at 100° C. against an IDTBT device that is annealed for 1 hour at the same temperature (black line—lowest line in FIG. 7 a). Since all solvents that are used have high boiling points >180° C., some even above 200° C., annealing at a relatively low temperature of 100° C. for a short time will leave a significant concentration of residual solvent in the film. The amount of residual solvent in a conjugated polymer under these conditions is on the order of a few weight percent relative to the polymer, as quantified below. Comparing the saturation transfer characteristics at Vds=−50V it is apparent, that IDTBT devices with residual solvent in the film perform significantly better than devices with the solvent removed after 1 hour of annealing. This applies to IDTBT films spun from various aromatic solvents such as Chlorobenzene, 1,2, Dichlorobenzene, 1,2,4-Trichlorobenzene, Toluene, o-Xylene and Mesitylene (Structures shown in FIG. 7 (a) as well as non-aromatic solvents such as Cycloalkanes (e.g. Chlorocyclohexane)).

However, not all solvents provide this performance benefit. An experiment aimed at deliberately leaving relatively high amounts of the solvents Tetralin or 1-Methylnaphthalene in the polymer films did not show an improvement in device performance and stability. The same was observed for a high-electron affinity molybdenum dithiophene complex as well as the molecule tetrathiafulvalene (TTF). The inventors conclude that these solid and liquid additives were not leading to an improvement in device performance and stability due to their greater size (containing at least two 5 or 6-membered rings) or due to their relatively low solubility in the organic semiconductor causing them to remain in the polymer film at only excessively low concentrations.

The additives should preferably not degrade transistor performance by inducing a threshold shift, reduce the semiconductor mobility and or increase the transistor off current.

FIG. 7 (b) shows the change in threshold voltage during constant-current stress and a subsequent recovery period performed in a nitrogen environment. The figure highlights the improvement in the constant-current stress stability (at 2.5 uA) when the solvent is left in the semiconducting film. An increase in the source-drain current by 2 orders of magnitude (100 uA) still shows a stark improvement in constant-current stress stability when compared to a transistor with a semiconductor that has been annealed for 1 hour to remove all solvent.

The beneficial effects of the incorporation of the molecular additive have been observed not just for IDTBT, but for a wide range of organic semiconductors. FIG. 7 (c) shows that leaving the solvent in the film has the same beneficial effect on poly[(9,9-di-n-octylfluorenyl-2,7-diyl)-alt-(benzo[2,1,3]thiadiazol-4,8-diyl)] (F8BT) transistors. The transistors shown are spun from o-xylene and were annealed for 2 minutes and 1 hour, respectively. Just as demonstrated in FIG. 7 (a) for the polymer IDTBT, the F8BT transistor annealed for a short time, shows orders of magnitude improvements of device performances. FIG. 7 (d) shows the linear (dashed line) and saturation (continuous line) regime transfer characteristics of two transistors that consist of poly-diketopyrrolopyrrole-co-dithienothiophene (DPP-DTT) as the semiconducting layer, annealed for 2 minutes and 1 hour, respectively. The transistors shown are spun from 1,2-dichlorobenzene. The transistor with residual solvent shows a dramatic improvement over the one annealed for 1 hour. FIG. 7 (e) shows the change in threshold voltage during constant-current stress and a subsequent recovery period of DPP-DTT based transistors. The measurement was performed in a nitrogen environment. The case where residual solvent is left in the semiconducting film shows a marked improvement over the annealed transistor, both stressed at 2.5 uA. The improved stability is maintained even when the source-drain current is increased by an order of magnitude (50 uA).

The inventors of the present invention have also quantified the amount of solvent molecules that are deliberately left in polymer films using two independent techniques, ellipsometry and quartz crystal microbalance measurements. FIG. 8 (a) shows an ellipsometry measurement of an IDTBT film with the solvent (Dichlorobenzene) deliberately left in the film. By fitting the data with an effective medium approximation (EMA) model, the fraction of voids in the polymer film was quantified. Here, the fraction of voids approximately displays the amount of free volume within the polymer that can be occupied by the solvent additive. Assuming a complete filling of all voids with a solvent additive of refractive index n=1.55 (refractive index of dichlorobenzene), a void fraction of 1.04% could be identified. FIG. 8 (b) shows the identical polymer film after an additional hour of annealing at 100° C. Assuming a refractive index of n=1.55 for the filler material in the voids, a fit of the data in FIG. 8 (b) is not possible indicating that most of the solvent has evaporated from the polymer film. When instead, a refractive index of n=1.33 (refractive index of water) is assumed, a good fit of the data is achieved, yielding a slightly elevated void fraction of 2.48%. Assuming a filling of the void with a mixture of water and air (average refractive index between 1 and 1.33), a good fit is obtained yielding the same void fraction as obtained before annealing. This results suggests that after removing the solvent from the voids by annealing, the voids are at least partially filled with water from the atmosphere.

The results on IDTBT were additionally firmed up by using quartz crystal microbalance (QCM) measurements. Here, an IDTBT film was spun on a quartz crystal and annealed for 2 minutes at 100° C. The resonance frequency of the crystal was then determined before and after the film was annealed for a further hour at 100° C. Since the resonance frequency of the quartz crystal is linearly dependent on weight, the mass loss of the polymer film during annealing (i.e. the amount of solvent leaving the polymer film) could be identified to be 0.6%. This agrees well with the ellipsometry data from FIGS. 8 (a) and (b). The same measurement was conducted for IDTBT films with different side chains resulting in a mass loss that varied between 0.6% and 1.5%. These results show that the amount of solvent additive required for an improvement in device performance and stability as claimed by the inventors in the present application, varies with the free volume which is present in a polymer. This free volume depends on the detailed molecular structure and molecular packing of the polymer chains in the thin films. However, in most systems presence of solvent additives at about 1 wt % or more will be sufficient to improve the overall device performance and stability.

In terms of the molecular mechanism for the beneficial effect of the molecular additives we have clearly established that molecular charge transfer doping is not responsible for the performance improvement as discussed above. To identify the molecular mechanism we have investigated the role of water incorporated into the films, as water is always present in organic semiconductor films, even when device fabrication is performed under inert atmosphere conditions, and is known to be responsible for charge trapping in organic semiconductors (see for example, Bobbert et al., Adv. Mat. 24, 1146 (2012)). FIG. 9(a) shows the transfer characteristics (at Vds=−50V) of a transistor with no additives which has been exposed to controlled environments of dry air ($N_2+O_2$) in a), and humid nitrogen ($N_2+H_2O$, 80% RH at 24° C.) in b) in order to distinguish the effect of one atmospheric species in the absence of the other. This experiment confirms that water residing in the polymer film, as well as ambient humidity is the culprit causing the poor performance, whilst oxygen works to alleviate the effect of water.

Figure 9:
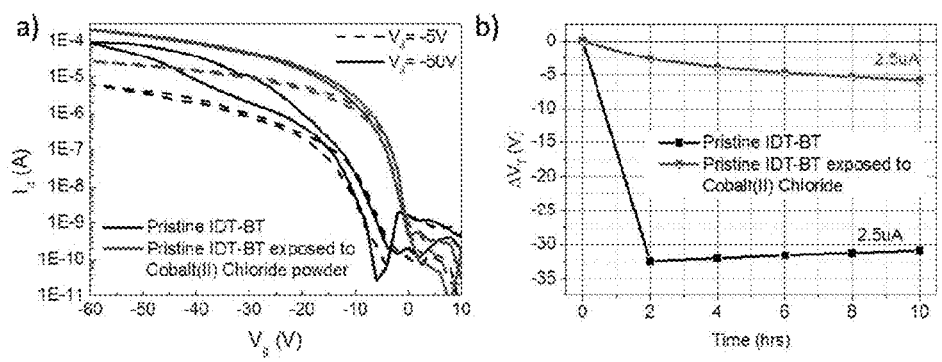
FIG. 9 a) and b) show results indicating that poor device performance is caused by water. Removal of water from the device leads to a significant increase in device performance and stability.

FIG. 9 (b) shows further evidence that the presence of water in the organic host material is the predominant reason for poor performance and stability of polymer transistors. In the left panel of FIG. 9 (b) an experiment is shown in which a polymer transistor was stored together with powder of the highly water absorbing material Cobalt(II)Chloride for the duration of 48 hours. The storage was done in a sealed box inside a nitrogen glove box and the transistor was in non-contact with the Cobalt(II)Chloride. By comparison to a reference sample that was stored under the same conditions (but without any Cobalt(II)Chloride powder) it is found that the Cobalt(II) chloride "treated" device performs significantly better—very much like devices comprising an additive such as a F4TCNQ, TCNQ, ABN or a solvent. In the right panel of FIG. 9 (b) the improvement in stress stability for the Cobalt(II)Chloride treated device as compared to the reference device is shown. Since a different architecture was used (Bottom-gate with SiO2 instead of top-gate with CYTOP in order not to hinder with any layers on top of the semiconductor the out-diffusion of water molecules from the polymer film and the subsequent capture by the Cobalt(II) Chloride), the stress measurements cannot be directly compared to those shown in FIG. 3. From these experiments, it can conclusively be deduced that removing water from the host organic material leads to a significant increase in performance and stress stability.

Without wishing to be bound by theory, the inventors' hypothesis for the mechanism behind the observed improvement in performance stability is as follows. Our results strongly suggests that the addition of a molecular additive to the organic semiconductor is able to overcome the adverse effects of water-induced hole traps.

Water has previously been identified as an important source of hole traps in organic semiconductors. There is evidence that water can create both shallow trap states that degrade the electrical characteristics of organic transistors by, for example, reducing the sub-threshold slope (Ref.), as well as deep trap states that manifest themselves as threshold voltage shifts during the long term operational stress degradation of devices (Bobbert et al., Adv. Mat. 24, 1146 (2012)). For the latter a molecular mechanism has been proposed that involves the electrochemical oxidation of water according to the reaction $4\ OSC^+ + 2\ H_2O \rightarrow 4H^+ + O_2 + 4\ OSC$. This reaction that happens if water molecules are present within the organic semiconductor layer causes a mobile hole carrier induced within the HOMO level of the organic semiconductor or, in electrochemical language, a radical cation ($OSC^+$) to be converted into an electronically immobile proton H. The organic semiconductor then remains in a neutral state and the protons migrate under the influence of the applied gate field into the gate dielectric and cause the threshold voltage of the transistor to increase. Whether such reaction proceeds all the way as a multi-electron electrochemical oxidation to the evolution of molecular oxygen (as implied by the above reaction), which may require a catalytic environment to bind the various intermediate molecular species in a well-defined molecular geometry (analogous to that present in the photosynthetic reaction center) or whether it proceeds as a single electron reaction that binds the originally mobile positive charge strongly to a water molecule (or to a cluster of water molecules) the result is that the originally mobile charge carrier on the organic semiconductor has been converted into a deeply trapped charge that is no longer able to carry an electronic current.

The inventors of the present invention also note that the charge trapping process occurring in the presence of water may in fact not involve neutral water molecules, but ionic species that are naturally present within water. For example, depending on the pH of the water a small concentration of negatively charged hydroxyl ions, $OH^-$, and positively charged hydronium ions, $H_3O^+$, are present within water. Hydroxyl ions, in particular, could react with the positive hole charge carriers induced on the organic semiconductive polymer in p-type operation mode, which could lead to trapping of the holes on the polymer by formation of hydroxyl radicals .OH. This trapping is likely to be the more prominent the larger the pH of the water source is, from which the water molecules incorporated within the organic semiconductive polymer stem.

The common belief in the community has been that the only way to prevent this undesirable trapping reaction is to eliminate water from the films. This is very difficult to achieve even if a rigorous final encapsulation of the device stack is provided. Water is present during the synthesis of the organic semiconductors, which is typically performed in air. Even if device processing is performed in an inert atmosphere glovebox the concentration of water in the glovebox is typically on the order of a few ppm. During deposition of the organic semiconductor film and during device processing water molecules are incorporated into small, nanometer-sized pores within the film, from which they are nearly impossible to completely remove. It is therefore almost impossible to exclude the presence of water within the films.

The results demonstrated in this disclosure demonstrate that the detrimental effect of residual water in the organic semiconductor can be overcome by incorporating within the organic semiconductor film a small molecular additive that is of a similar molecular size as a water molecule and has an affinity to form a non-covalent bond with the organic semiconductor such that it is readily incorporated into the same nanometer-sized cavities within the organic semiconductor that water is incorporated in. When incorporated the molecular additive is able to perturb the electrochemical reaction between water and the radical cations on the organic semiconductor, such that this reaction is no longer able to proceed efficiently. The detailed molecular mechanism by which the additive interacts with the water molecule and with the organic semiconductor is difficult to establish by direct experimental or spectroscopic characterization because of the minute concentrations of molecular species that are involved and is also likely to depend on the type of additive. For the solvent molecules listed it may, for example, involve an energetically favourable, π-π interaction between the organic semiconductor and the solvent molecules that removes direct physical contact between the organic semiconductor and the water molecule, i.e., the solvent molecules insert themselves in between the organic semiconductor and the water molecules. Since the ionization potential of the molecular additives is chosen to be much deeper than that of the organic semiconductor, the positive holes induced in the organic semiconductor remain spatially separated from the water molecules. Alternatively, one might presume that additives like oxygen or molecules with strong electronegative groups form non-covalent, hydrogen bonds with the water molecules that perturb the delicate molecular geometry and charge distribution around the water molecule and in this way suppress the ability of water molecules to undergo and electrochemical reaction with the radical cations on the organic semiconductor. Whatever the precise molecular mechanism is our results show clearly that it is possible to suppress the undesirable trapping effects induced by residual water by filling the nanoscale pores within the organic semiconductor into which water is incorporated by a molecular additive. In the case of using a polycrystalline small molecule material for the semiconductive material, water may be incorporated at grain boundaries.

The molecular additive preferably has the following properties:

(i) The molecular size of the additive is comparable to that of a water molecule, such that the additive can become incorporated into the small, nanometer-sized pores. The molecular additive should therefore be smaller than preferably 5 nm, more preferably smaller than 2 nm, most preferably smaller than 1 nm. Molecular size is defined here as the distance between the two atoms that are furthest apart within the molecule.

(ii) For a device operating in p-type mode the electron affinity of the molecular additive is smaller than the ionization potential of the organic semiconductor, such that the incorporation of the additive does not lead to molecular p-type doping of the organic semiconductor and an undesirable increase in OFF current. The electron affinity of the molecular additive is therefore preferably smaller by 0.1 eV than the ionization potential of the organic semiconductor, more preferably smaller than 0.3 eV, most preferably smaller than 0.5 eV. Analogously, for a device operating in n-type mode, the ionization potential of the molecular additive should be higher than the electron affinity of the organic semiconductor, in order to prevent undesirable n-type doping of the organic semiconductor by the molecular additive.

(iii) The ionization potential of the molecular additive should be larger than that of the organic semiconductor, such that holes induced on the organic semiconductor cannot be injected onto the molecular additive. The ionization potential of the molecular additive should be larger than that of the organic semiconductor preferably by 0.3 eV, more preferably 0.5 eV and most preferably by 1 eV. An analogous criterion applies to the electron affinity of the molecular additive with respect to the electron affinity of the organic semiconductor in the case of devices operating in n-type mode.

(iv) The weight ratio between the molecular additive and the organic semiconductor in the films is preferably on the order of at least 1%, such that all nanoscale pores/voids can be filled with the additive without the additive degrading the transport properties of the organic semiconductor by interrupting the charge transport pathways in the organic semiconductor. In the case of a solid additive this requires the additive to have a solid solubility of at least 1% in the organic semiconductor.

(v) The molecular additive has preferably a non-covalent, favourable binding interaction with the organic semiconductor that is comparable in strength or larger than that between the organic semiconductor and water such that the molecular additive is easily incorporated into the nanoscale pores and is able to compete with water for binding sites on the organic semiconductor. This will generally mean that the molecular additive has a higher solubility in the organic semiconductor than water has in the organic semiconductor.

(vi) Preferably, the molecular additive is also able to undergo a non-covalent hydrogen bonding interaction with water, such that it can perturb the molecular geometry and/or the electron density distribution around the water molecules within the nanoscale pores and in this way suppress the electrochemical oxidation of water in the presence of radical cations on the organic semiconductor. This will generally mean that the molecular additive will exhibit a finite solubility in water, preferably higher than 0.1%.

(vii) The molecular additive should not degrade the TFT performance by either shifting the threshold voltage by more than 2 V, more preferably not by more than less than 1V, and most preferably not by more than 0.3V. Also the molecular additive should not reduce the organic semi-conductor mobility by more than 20%, more preferably not by more than 5% and most preferably not by more than 2%. Finally the molecular additive should not increase the transistor off current by more than 10×, more preferably by not more than 5× and most preferably by not more than 1.2×.

Figure 10:
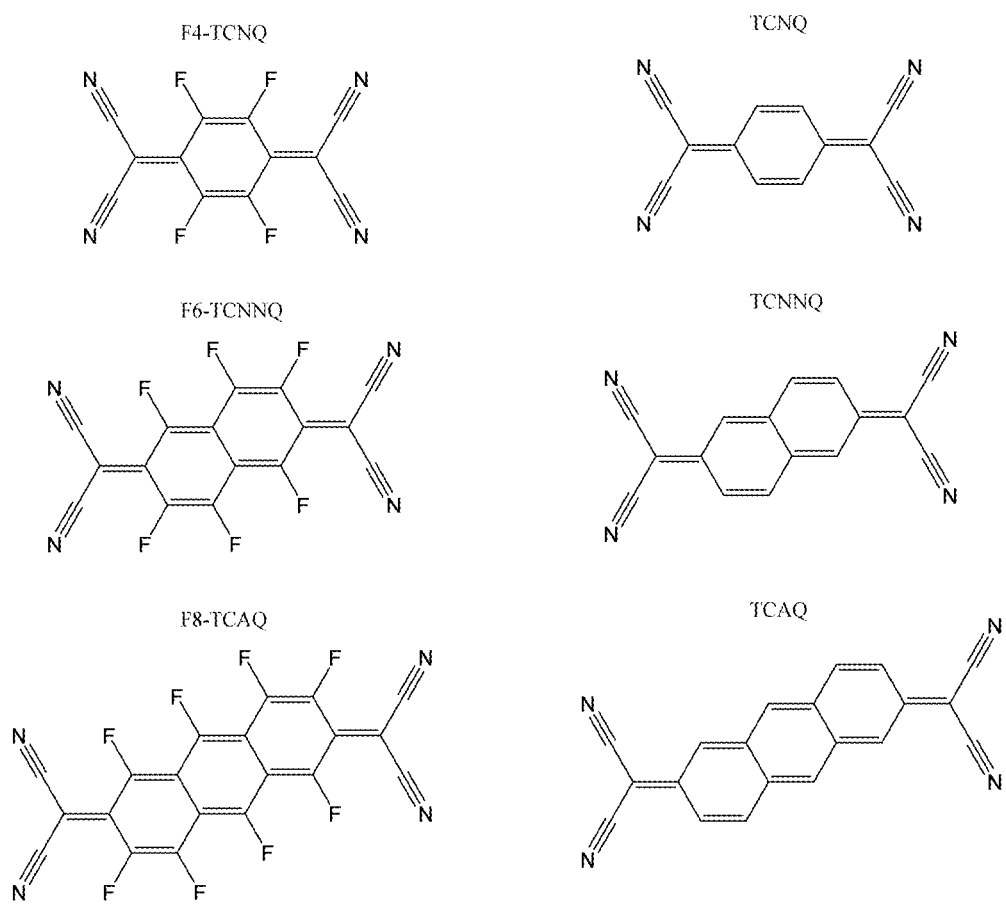
FIG. 10 shows the chemical structures of some examples of solid additives according to the present invention.

(viii) The molecular additive preferably has a high thermal stability within the pores of the organic semiconductor and does not evaporate or sublime from the pores during heating of the device at temperatures of 30-120° C. that are typical during device manufacture or operation. The melting/sublimation (boiling) temperature of the solid (liquid) organic semi-conductor is preferably chosen to be above the highest temperature reached during device manufacture/operation. The inventors of the present invention have found that the beneficial effect of additives such as TCNQ or F4-TCNQ may be lost when the device is heated above 90-100° C. However, when using slightly larger molecules with still sufficient solubility in the organic semi-conductor but higher thermal stability, such as 2,2'-(perfluoronaphthalene-2,6-diylidene)dimalononitrile (F6-TCNNQ) or, preferably, the non-fluorinated derivative TCNNQ (see FIG. 10), which does not lead to p-type doping due to its low electron affinity, the thermal stability was found to be significantly improved. Even larger additives such as the anthracene derivative TCAQ may also be used.

The desirable removal of water-related traps in the organic semiconductor by the addition of a molecular additive can be applied to a range of electronic and optoelectronic devices, including, but not limited to, transistors in either planar or vertical architecture, rectifying diodes, light-emitting diodes (LEDs) and solar cells. Vertical transistors, LEDs and solar cells rely on charge transport through the bulk of the organic semiconductor as opposed to transport along the interface, which is also highly sensitive to the presence of charge carrier traps. The results shown in FIG. 3e on the improvement of the contact resistance by the molecular additive demonstrate that the molecular additive is indeed able to improve not only the interfacial, but also the bulk transport properties, since the in the staggered, bottom-contact, top-gate device architecture used here, the contact resistance is largely determined by the current transport through the bulk of the organic semiconductor film between the source/drain electrodes and the accumulation layer at the active interface.

The presence of a molecular additive in the polymer film can be detected by a range of analytical techniques known in the prior art. At the concentrations of a few % that are typically needed to fill the voids in the polymer film, a wide range of analytical techniques have sufficient sensitivity, such as X-ray photoelectron spectroscopy, infrared or Raman spectroscopy or various forms of mass spectrometry. A particularly sensitive method to detect the presence of the small molecular additive makes use of the fact that typical molecular additives have a lower boiling/sublimation temperature than the decomposition temperature of the polymer. This analysis is performed in three steps: First the composition of the polymer film as it is found in the electronic device is analysed by any of these techniques. Then the polymer film is annealed at a temperature higher than the boiling/sublimation temperature of the molecular additive, but less than the degradation temperature of the polymer. During this annealing step the molecular additive is typically removed from the film while the composition of the polymer host remains unchanged. In the third step the chemical composition of the film is then re-measured. If there are significant differences in chemical composition before and after the annealing step one can conclude that a small molecular additive had been present in the film.

The invention claimed is:

1. A p-type semiconductor device comprising:
a semiconductor layer,
wherein the semiconductor layer comprises at least a semiconductive organic material, and at least one additive in an amount of at least 0.1% by weight relative to the semiconductive organic material, which additive occupies at least some voids within the semiconductive organic material occupiable by water molecules, and has a smaller charge carrier trapping effect on the semiconductive organic material than water, and
wherein the additive comprises a material having an electron affinity less than the ionization potential of the semiconductive organic material by at least 0.3 eV.

2. The device according to claim 1, wherein said device is an electronic switching device and the at least one additive reduces the threshold voltage change of the electron switching device to less than 1V in a stress test involving operating the electronic switching device in a saturation regime at a drain current of about 2.5 µA for a period of 25 hours.

3. The device according to claim 1, wherein the device is an electronic switching device, and the additive comprises a material having an electron affinity less than the ionization potential of the semiconductive organic material by at least 0.5 eV.

4. The device according to claim 1, wherein the additive comprises a molecular material having a molecular weight of less than 5% of the number average molecular weight of the semiconductive organic material.

5. The device according to claim 1, wherein the additive has a higher solubility at room temperature in the organic semiconductive material than water has in the organic semiconductive material.

6. The device according to claim 1, wherein the additive has a solubility of at least 0.1% in water.

7. The device according to claim 1, wherein the semiconductor layer comprises residual water molecules in an amount of at least 0.1% by weight.

8. The device according to claim 1, wherein the semiconductor layer is encapsulated together with one or more other layers of the device against the ingress of oxygen.

9. The device according to claim 1, wherein said additive is solid at room temperature and has a solid solubility higher than 1% by weight in the semiconductive organic material.

10. The device according to claim 1, wherein the amount of said additive is at least 1% by weight relative to the semiconductive organic material.

11. The device according to claim 2, wherein the at least one additive reduces the threshold voltage change of the electron switching device to less than 0.7V in said stress test.

12. A p-type semiconductor device comprising:
a semiconductor layer, wherein the semiconductor layer comprises at least a semiconductive organic material, water species, and at least one additive in an amount of at least 0.1% by weight relative to the semiconductive organic material, which additive at least partly negates a charge carrier trapping effect caused by the water species on the semiconductive organic material,
wherein the additive comprises a material having an electron affinity less than the ionization potential of the semiconductive organic material by at least 0.3 eV, and
wherein the device is an electronic switching device, and the additive comprises a material having an ionization potential greater than the ionization potential of the semiconductive organic material by at least 0.3 eV.

13. The device according to claim 12, wherein the additive comprises a material having an ionization potential greater than the ionization potential of the semiconductive organic material by at least 0.5 eV.

14. The device according to claim 12, wherein the additive comprises a material having an ionization potential greater than the ionization potential of the semiconductive organic material by at least 1 eV.

15. A p-type semiconductor device comprising:
a semiconductor layer, wherein the semiconductor layer comprises at least a semiconductive organic material, water species, and at least one molecular additive in an amount of at least 0.1% by weight relative to the semiconductive organic material, which molecular additive at least partly negates a charge carrier trapping effect caused by the water species on the semiconductive organic material,
wherein the molecular additive comprises a material having an electron affinity less than the ionization potential of the semiconductive organic material by at least 0.3 eV,
wherein said molecular additive is liquid at room temperature and is a solvent for the semiconductive organic material, and
wherein the solubility of the semiconductive organic material in the liquid molecular additive is at least 0.1% by weight.

16. The device according to claim 15, wherein the boiling point of said additive is higher than 150° C.

17. A p-type semiconductor device comprising:
a semiconductor layer, wherein the semiconductor layer comprises at least a semiconductive organic material, water species, and at least one molecular additive in an amount of at least 0.1% by weight relative to the semiconductive organic material, which molecular additive at least partly negates a charge carrier trapping effect caused by the water species on the semiconductive organic material,
wherein the molecular additive comprises a material having an electron affinity less than the ionization potential of the semiconductive organic material by at least 0.3 eV,
wherein said device is an electronic switching device and the incorporation of the molecular additive reduces the threshold voltage shift of the electronic switching device in a stress test by 50% compared to that of a reference device, in which no molecular additive is incorporated in said semiconductive organic material, and
wherein said stress test involves operating the device in the saturation regime at a drain current of about (0.25

µA×W/L) for a period of 25 hours, where W and L are the channel width and channel length of the electronic switching device.

* * * * *